United States Patent
Peng et al.

(10) Patent No.: US 11,329,096 B2
(45) Date of Patent: May 10, 2022

(54) FINGERPRINT SENSING MODULE

(71) Applicant: Egis Technology Inc., Taipei (TW)

(72) Inventors: Tzu-Yang Peng, Taipei (TW);
Ming-Yuan Cheng, Taipei (TW);
Chung-Yi Wang, Taipei (TW);
Yu-Hsuan Lin, Taipei (TW)

(73) Assignee: Egis Technology Inc., Hsinchu (TW)

( * ) Notice: Subject to any disclaimer, the term of this patent is extended or adjusted under 35 U.S.C. 154(b) by 30 days.

(21) Appl. No.: 17/004,017

(22) Filed: Aug. 27, 2020

(65) Prior Publication Data

US 2021/0225926 A1    Jul. 22, 2021

Related U.S. Application Data

(60) Provisional application No. 62/962,137, filed on Jan. 16, 2020.

(30) Foreign Application Priority Data

Jun. 29, 2020  (CN) .......................... 202010601525.6

(51) Int. Cl.
*H01L 27/146* (2006.01)
*G06V 40/13* (2022.01)

(52) U.S. Cl.
CPC .... *H01L 27/14678* (2013.01); *G06V 40/1318* (2022.01); *H01L 27/14609* (2013.01); *H01L 27/14623* (2013.01); *H01L 27/14627* (2013.01)

(58) Field of Classification Search
CPC ......... H01L 27/14678; H01L 27/14609; H01L 27/14623; H01L 27/14627; G06K 9/0004
See application file for complete search history.

(56) References Cited

U.S. PATENT DOCUMENTS

2010/0067757 A1*  3/2010  Arai .................... G06K 9/0004
                                                            382/128
2017/0357840 A1   12/2017  Chen et al.

FOREIGN PATENT DOCUMENTS

| CN | 110379826 | 10/2019 |
|---|---|---|
| CN | 209560569 | 10/2019 |
| TW | I549065 | 9/2016 |
| TW | M585937 | 11/2019 |
| TW | 202006598 | 2/2020 |
| TW | M602663 | 10/2020 |

OTHER PUBLICATIONS

"Office Action of Taiwan Counterpart Application", dted Dec. 29, 2020, p. 1-p. 6.

* cited by examiner

*Primary Examiner* — Que Tan Le
*Assistant Examiner* — Don J Williams
(74) *Attorney, Agent, or Firm* — JCIPRNET

(57) ABSTRACT

A fingerprint sensing module including an image sensor, a microlens array and a light-shielding layer is provided. The image sensor has multiple pixels. Each of the pixels has multiple light-sensing regions physically separated. Each of the light-sensing regions is adapted to receive an image beam coming from a fingerprint of user. The microlens array is disposed above the image sensor. The microlens array includes multiple microlens. A focus region of each of the microlens covers a portion of the light-sensing regions. The light-shielding layer is disposed between the image sensor and the microlens array. The light-shielding layer has multiple openings, and the positions of the openings are corresponded to the positions of the pixels.

10 Claims, 5 Drawing Sheets

FINGERPRINT SENSING MODULE

CROSS-REFERENCE TO RELATED APPLICATION

This application claims the priority benefits of U.S. provisional application Ser. No. 62/962,137, filed on Jan. 16, 2020, and China application serial no. 202010601525.6, filed on Jun. 29, 2020. The entirety of each of the above-mentioned patent applications is hereby incorporated by reference herein and made a part of this specification.

BACKGROUND

1. Technical Field

The disclosure relates to a fingerprint sensing module, in particular, to an optical fingerprint sensing module.

2. Description of Related Art

An existing approach to optical fingerprint identification is to incorporate a microlens array and a light-shielding layer with multiple openings. Usually, each opening of the light-shielding layer is positioned corresponding to the center of a microlens. When a beam illuminates a fingerprint of a finger, the fingerprint reflects the beam to form an image beam with a fingerprint information, and the microlens focuses the image beam so that the image beam penetrates the opening and focuses on the pixels of an image sensor, thereby sensing the fingerprint image.

However, the problem with the above architecture is that during bonding process of the light-shielding layer, it is not always possible to precisely align the opening to the central axis of the microlens. If the opening is misaligned with the central axis of the microlens, the image beam will be blocked by the non-opening areas of the light-shielding layer and cannot be transmitted to the pixels, resulting in poor image sensing quality. To avoid the above problem, the microlens, the light-shielding layer, and the pixel in the optical fingerprint recognition device need to be precisely aligned, but in this way the overall manufacturing cost is difficult to reduce.

SUMMARY

The disclosure provides a fingerprint sensing module with good fingerprint image sensing quality and low manufacturing cost.

In an embodiment of the disclosure, a fingerprint sensing module is provided including an image sensor, a microlens array, and a light-shielding layer. The image sensor has multiple pixels. Each pixel has multiple physically separated light-sensing regions, and each light-sensing region is adapted to receive an image beam from a user's fingerprint. The microlens array is disposed above the image sensor. The microlens array includes multiple microlenses, where a focus region of each microlens covers part of the light-sensing regions. The light-shielding layer is disposed between the image sensor and the microlens array. The light-shielding layer has multiple openings, and positions of the openings correspond to positions of the pixels.

In summary, in the fingerprint sensing module of the embodiments of the disclosure, each pixel of the image sensor is further divided into multiple smaller light-sensing regions, and the image beam illuminates part of the photosensitive regions through the microlens. Accordingly, whether or not the central axis of the opening of the light-shielding layer is aligned with the central axis of the microlens caused during bonding, at least one of the light-sensing regions can sense the image beam; thus the fingerprint sensing module has good image sensing quality. Also, the alignment requirement of the fingerprint sensing module is not too high, therefore the high manufacturing cost can be avoided.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
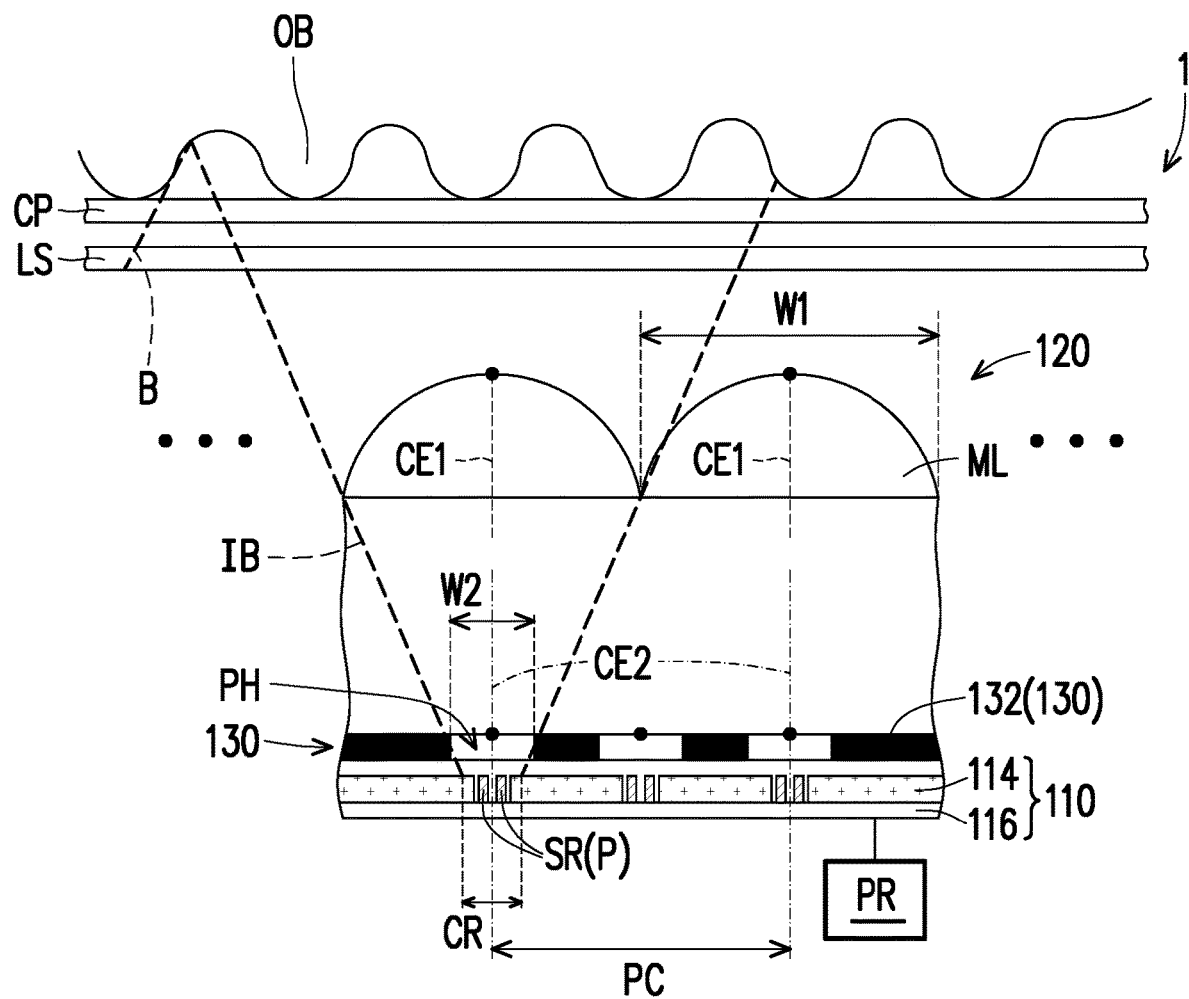
FIG. 1 is a schematic view of a fingerprint sensing module according to an embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

Figure 2A:
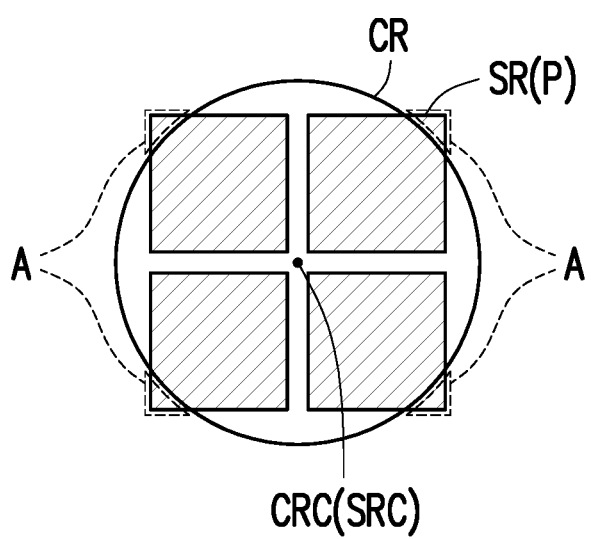
FIG. 2A and FIG. 2B are schematic top views of an image beam illuminating pixels in a different embodiment under the architecture of FIG. 1.
Figure 2B:
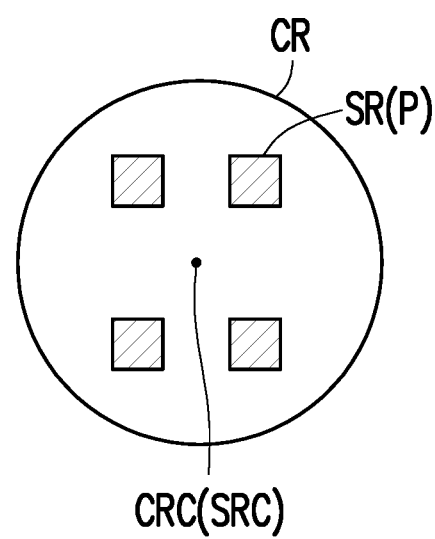
Figure 3:
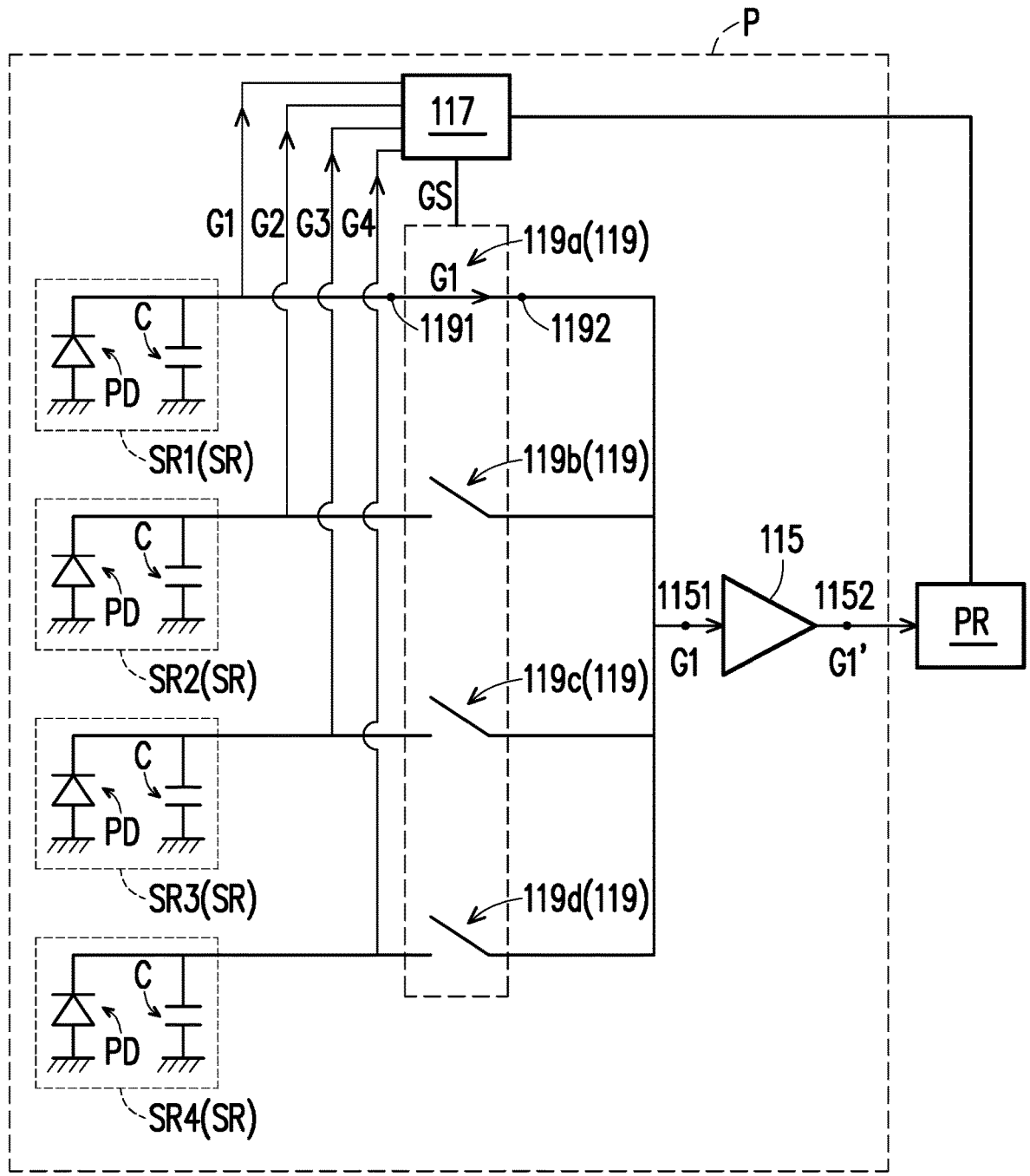
FIG. 3 is a brief schematic circuit view within each pixel in FIG. 1.

FIG. 1 is a schematic view of a fingerprint sensing module according to an embodiment of the disclosure. FIG. 2A and FIG. 2B are schematic top views of an image beam illuminating pixels in a different embodiment under the architecture of FIG. 1. FIG. 3 is a brief schematic circuit view within each pixel in FIG. 1.

Please refer to FIG. 1. In the present embodiment, a fingerprint sensing module 100 includes an image sensor 110, a microlens array 120 and a light-shielding layer 130. The fingerprint sensing module 100 is integrated into an electronic device 1, where the electronic device 1 is, for example, a mobile phone, but the disclosure is not limited thereto. In addition to the fingerprint sensing module 100, the electronic device 1 further includes, for example, a light source LS, a translucent cover CP, and a processor PR. In the following paragraphs, the dispositional relationship between the components is described in detail.

Please refer to FIG. 1. In the present embodiment, the image sensor 110 is an electronic component that may convert an optical signal into an electrical signal, thereby converting an image beam from an object into an image information. In the present embodiment, the image sensor 110 is, for example, a Complementary Metal Oxide Semiconductor (CMOS) image sensor, a Charge Couple Device (CCD) image sensor, a thin film transistor image sensor, or other suitable types of image sensors, but the disclosure is not limited thereto.

Please refer to FIG. 1 again. Overall speaking, the image sensor 110 further includes multiple pixels P, a circuit layer 114, and a circuit board 116. The pixels P and the circuit layer 114 are disposed on the circuit board 116. Each pixel P has multiple physically separated light-sensing regions SR, and the circuit layer 114 is provided between any two adjacent pixels P. Please refer to FIG. 2A, FIG. 2B and FIG. 3. In the present embodiment, the number of the light-sensing regions SR is four, for example, but the disclosure is not limited thereto. The four light-sensing regions are marked as SR1-SR4, respectively. In other embodiments, there may be less than four or more than four light-sensing regions, but the disclosure is not limited thereto.

The microlens array 120 is disposed above the image sensor 110 and includes multiple microlenses ML disposed in an array. Each microlens ML has a central axis CE1 passing through the center of the lens. Referring to FIG. 1, a width W1 of each microlens ML is within 10 μm to 100 μm, for example, but the disclosure is not limited thereto. A pitch PC between the microlenses ML is within 10 μm to 100 μm, where the pitch PC is defined as a distance between the central axes CE1 of two adjacent microlenses ML, but the disclosure is not limited thereto.

The light-shielding layer 130 is made from an opaque material layer 132, and is provided with multiple openings (perforations) PH for light to pass through, where a width W2 of the opening PH is within 1 μm to 10 μm, for example, but the disclosure is not limited thereto. Each opening PH also has a central axis CE2 passing through the center. In one embodiment, the central axis CE1 of the microlens ML is aligned (or overlapped) with the central axis CE2 of the opening PH.

The processor PR is electrically connected to the circuit board 116 of the image sensor 110, and receives signals from the pixel P through the circuit board 116.

The light source LS is a photoelectric component that may emit beam. In the present embodiment, the light source LS may be a display panel. In other embodiments, the light source LS may also be a light-emitting diode, an organic light-emitting diode, or other suitable light-emitting components, but the disclosure is not limited thereto. The light source LS is disposed between the translucent cover CP and the microlens array 120.

The translucent cover CP is an optical component, made of glass, for example, that allows the beam to penetrate and provide a function of protecting the above components. The translucent cover CP is disposed above the light source LS.

The optical effect of the present embodiment is described in detail in the following paragraphs.

Referring to FIG. 1, when a finger OB of a user touches the translucent cover CP of the electronic device 1, the light source LS emits a beam B. The beam B penetrates the translucent cover CP and reaches the fingerprint of the finger OB. The fingerprint reflects the beam B to form an image beam IB with a fingerprint information. The image beam IB sequentially penetrates the translucent cover CP and the light source LS and is focused by a microlens ML of the microlens array 120, then passes through the opening PH of the light-shielding layer 130 and reaches the pixels P of the image sensor 110. Disposing the light-shielding layer 130 can effectively prevent stray light from entering the pixels P, so that the image quality is not affected by the stray light.

Referring to FIG. 2A, the image beam IB is focused on part of the light-sensing regions SR (where a focus region CR overlaps with the light-sensing regions SR) via the microlens ML, while the other part A of the light-sensing regions SR are outside the focus region CR. In other embodiments, referring to FIG. 2B, the size of the light-sensing regions SR may be designed to be smaller than the light-sensing regions SR shown in FIG. 2A so as to allow the focus region CR to completely cover the light-sensing regions SR. In an embodiment, for example, in FIG. 2A and FIG. 2B, the central axis CE1 of the microlens ML is exactly aligned with the central axis CE2 of the opening PH, therefore a center CRC of the focus region CR of the microlens ML is aligned with a center SRC of the light-sensing regions SR, for example.

In the following paragraphs, a brief circuit of the pixel in FIG. 3 will be used to explain how to decide a partial image of the fingerprint corresponding to the pixel P.

Please refer to FIG. 3. The pixel P further includes an amplifier 115, a controller 117 and multiple switches 119. The amplifier 115 has a first terminal 1151 and a second terminal 1152 opposite to each other, and each switch 119 also has a first terminal 1191 and a second terminal 1192 opposite to each other. In the present embodiment, the number of the switch 119 is the same as the number of light-sensing region SR, which is four, for example, but the disclosure is not limited thereto. The four switches are marked as 119a-119d, respectively. The first terminal 1151 of the amplifier 115 is electrically connected to the second terminals 1192 of the switches 119, and the second terminal 1152 of the amplifier 115 is electrically connected to the processor PR. The controller 117 is connected to the light-sensing regions SR and the switches 119, and the switches 119 are controlled by the controller 117. In each light-sensing region SR of the pixel P, a photoelectric conversion component PD and a capacitor C are provided in parallel with each other. Both a terminal of the photoelectric conversion component PD and a terminal of the capacitor C are grounded, and the other terminal of the photoelectric conversion component PD and the other terminal of the capacitor C are connected to the first terminal 1191 of the corresponding switch 119. The photoelectric conversion component PD may be, for example, an optical diode, an optical gate, or an optical conductor, but the disclosure is not limited thereto.

Please refer to both FIG. 2A and FIG. 2B. When the image beam IB is focused by the microlens ML to the focus region CR, the processor PR decides an image of the image beam IB according to a maximum light intensity signal sensed in the focus region CR. In detail, the photoelectric conversion components PD in the light-sensing regions SR transmit light intensity signals G1-G4 sensed by the image beam IB to the controller 117 (as shown in FIG. 3). After receiving the light intensity signals G1-G4, the controller 117 compares the light intensity signals G1-G4 and obtains the maximum light intensity signal, and accordingly decides an optimal light-sensing region to which the maximum light intensity signal corresponds. The maximum light intensity signal is considered to be the signal sensed by the light-sensing region SR closest to the central axis CE1 of the microlens ML. After the above comparison, the controller 117 can tell which of the light-sensing regions SR is the optimal light-sensing region, and outputs a control signal GS accordingly to enable the switch 119 corresponding to the optimal light-sensing region and disable other switches 119.

Please refer to FIG. 3 again. For example, when the strength of the light intensity signal G1 measured by the light-sensing region SR1 is the largest of the light intensity signals G1-G4, the controller 117 determines the light-sensing region SR1 as the optimal light-sensing region, and enables the switch 119a corresponding to the light-sensing region SR1 and disables other switches 119b-119c. The amplifier 115 amplifies the maximum light intensity signal G1 and transmits it to the processor PR. The processor PR then decides a partial image of the fingerprint corresponding to the pixel P according to an amplified maximum light intensity signal G1'.

The image beams (not shown) of other microlenses ML are processed in a similar manner, and the processor PR forms a complete fingerprint image from the partial fingerprint images sensed by other pixels P. In this way, the processor PR can sense the fingerprint pattern and compare it with the fingerprint image stored in the system to facilitate identification.

It should be noted that the above description is only an example for the convenience of description; in other embodiments, the maximum light intensity signal may be sensed by any one of the light-sensing region SR2, the light-sensing region SR3, and the light-sensing region SR4, but the disclosure is not limited thereto.

It must be noted here that the following embodiments follow part of the contents of the above embodiments and omit the description of the same technical contents. For the components with the same names, reference may be made to part of the content of the above embodiments and are not repeated in the following descriptions of the embodiments.

Figure 4:
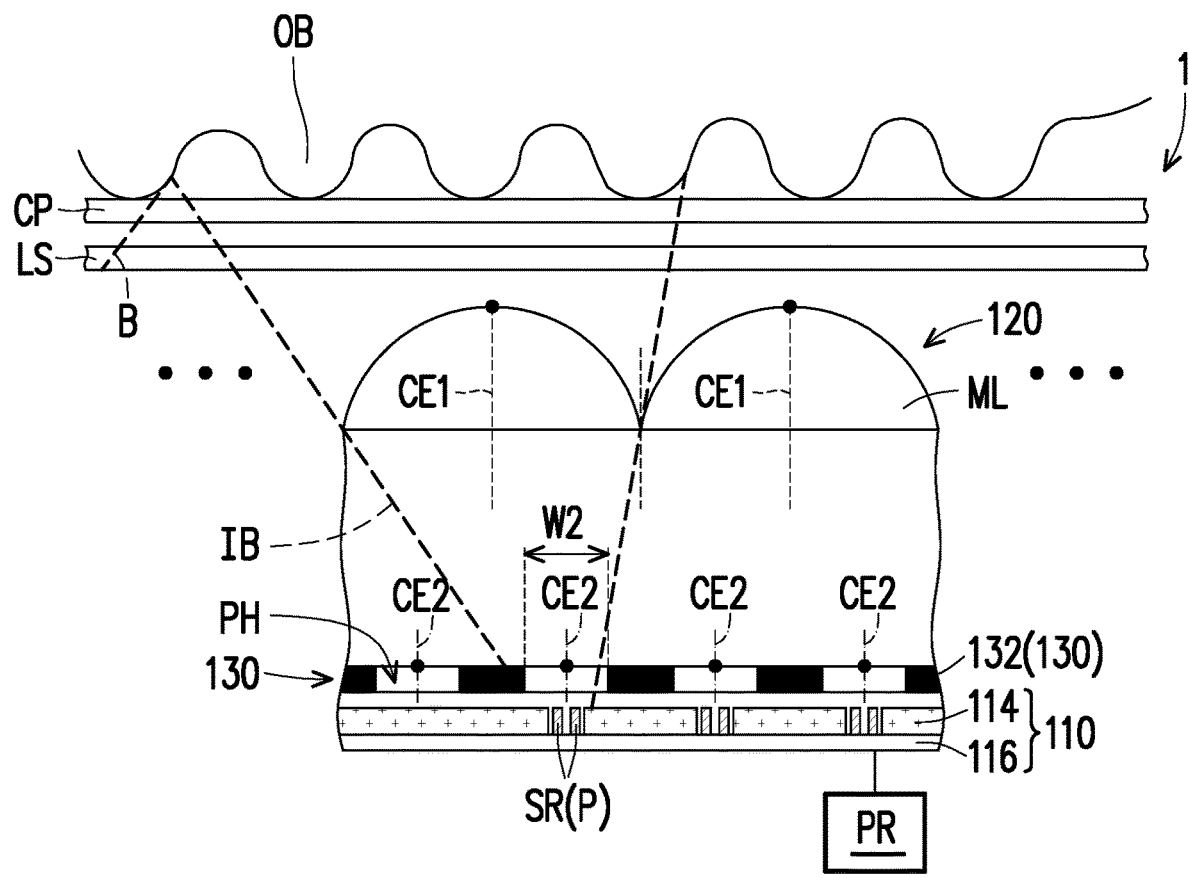
FIG. 4 is a schematic view of a fingerprint sensing module according to another embodiment of the disclosure.
Figure 5A:
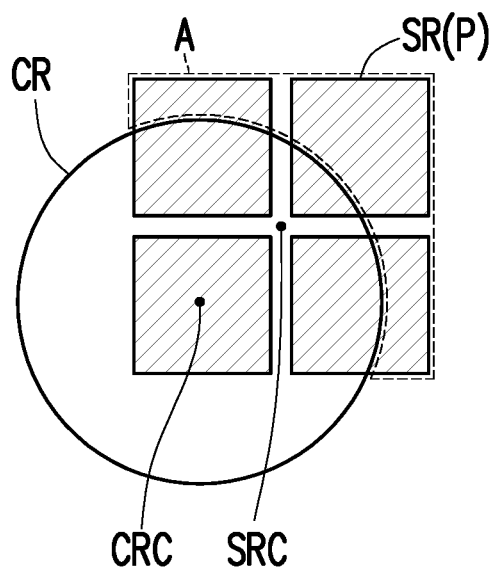
FIG. 5A and FIG. 5B are schematic top views of an image beam illuminating pixels in a different embodiment under the architecture of FIG. 4.
Figure 5B:
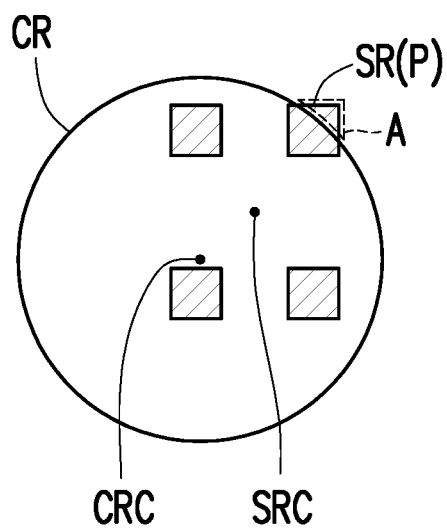

FIG. 4 is a schematic view of a fingerprint sensing module according to another embodiment of the disclosure. FIG. 5A and FIG. 5B are schematic top views of an image beam illuminating pixels in a different embodiment under the architecture of FIG. 4.

Referring to FIG. 4, the fingerprint sensing module 100a of FIG. 4 is substantially similar to the fingerprint sensing module 100 of FIG. 1; the main differences are: the central axes CE1 of the microlenses ML and the central axes CE2 of the openings PH are misaligned (or not overlapped). The reason for the misalignment may be due to process factors when the light-shielding layer 130 is bonded.

Please refer to FIG. 5A and FIG. 5B. Since the central axis CE1 of the microlens ML and the central axis CE2 of the opening PH are misaligned, the center CRC of the focus region CR deviates from the center SRC of the light-sensing region SR, causing at least part A of the light-sensing regions SR to fall outside the focus region CR. However, as long as the focus region CR of the microlens ML covers part of the light-sensing regions SR (where the focus region CR overlaps the light-sensing regions SR), the processor PR can decide the image of the corresponding image beam IB according to the above calculation.

In summary, in the fingerprint sensing module of the embodiments of the disclosure, each pixel of the image sensor is further divided into multiple smaller light-sensing regions, and the image beam illuminates part of the photosensitive regions through the microlens. Accordingly, whether or not the central axis of the opening of the light-shielding layer is aligned with the central axis of the microlens caused during bonding, at least one of the light-sensing regions can sense the image beam; thus the fingerprint sensing module has good image sensing quality. Also, the alignment requirement of the fingerprint sensing module is not too high, therefore the high manufacturing cost can be avoided.

In more detail, the fingerprint sensing module provides the maximum light intensity signal sensed within the focus region of the microlens to the processor of an back-end electronic device; the processor then determines the partial image of the fingerprint corresponding to the pixel according to the maximum light intensity signal. In this way, the electronic device using the fingerprint sensing module has good fingerprint recognition.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A fingerprint sensing module, comprising:
   an image sensor having a plurality of pixels, each of the pixels having a plurality of physically separated light-sensing regions, each of the light-sensing regions being adapted to receive an image beam from a user's fingerprint;
   a microlens array disposed above the image sensor, the microlens array comprising a plurality of microlenses, wherein a focus region of each microlen covers part of the light-sensing regions; and
   a light-shielding layer disposed between the image sensor and the microlens array, the light-shielding layer having a plurality of openings, positions of the openings corresponding to positions of the pixels,
   wherein each of the openings corresponds to more than one of the light-sensing regions respectively connected to a processor, the processor decides an image of the image beam based on a maximum light intensity signal sensed in the focus region when the image beam is focused on the light-sensing regions covered by the focus region through the microlens.

2. The fingerprint sensing module according to claim 1, wherein the maximum light intensity signal corresponds to an optimal light-sensing region in the focus region.

3. The fingerprint sensing module according to claim 2, wherein each of the pixels of the image sensor further comprises:
   an amplifier having a first terminal and a second terminal;
   a controller connected to the plurality of light-sensing regions; and
   a plurality of switches, each of the switches having a first terminal and a second terminal, the first terminal of the switch selectively connected to the corresponding light-sensing region and the second terminal connected to the amplifier, wherein the plurality of switches are controlled by the controller;
   wherein the controller is configured to receive a light intensity signal sensed in the focus region and obtain the maximum light intensity signal by comparing the strengths of the light intensity signals,
   wherein, according to the comparison result, the controller outputs a control signal to enable the switch corresponded to the optimal light-sensing region among the plurality of switches and disable other switches,
   wherein the amplifier amplifies the maximum light intensity signal and transmits the amplified maximum light intensity signal to the processor.

4. The fingerprint sensing module according to claim 1, wherein a pitch of the plurality of microlenses is within 10 μm to 100 μm.

5. The fingerprint sensing module according to claim 1, wherein a width of each opening is within 1 μm to 10 μm.

6. The fingerprint sensing module according to claim 1, wherein the light-shielding layer is an opaque material layer, and the opaque material layer comprises the plurality of openings.

7. The fingerprint sensing module according to claim 1, wherein a plurality of central axes of the plurality of microlenses are respectively aligned with a plurality of central axes of the plurality of openings.

8. The fingerprint sensing module according to claim 1, wherein a plurality of central axes of the plurality of microlenses are respectively misaligned with a plurality of central axes of the plurality of openings.

9. The fingerprint sensing module according to claim 1, wherein the plurality of light-sensing regions completely fall within the focus region of the corresponding microlens.

10. The fingerprint sensing module according to claim 1, wherein the plurality of light-sensing regions at least partially fall outside the focus region of the corresponding microlens.

* * * * *